(12) United States Patent
Swillam et al.

(10) Patent No.: US 12,306,541 B2
(45) Date of Patent: May 20, 2025

(54) LITHOGRAPHIC APPARATUS, METROLOGY SYSTEMS, ILLUMINATION SWITCHES AND METHODS THEREOF

(71) Applicants: ASML Holding N.V., Veldhoven (NL); ASML Netherlands B.V., Veldhoven (NL)

(72) Inventors: Mohamed Swillam, Wilton, CT (US); Marinus Petrus Reijnders, Eindhoven (NL)

(73) Assignee: ASML Holding N.V. & ASML Netherlands B.V., Veldhoven (NL)

( * ) Notice: Subject to any disclaimer, the term of this patent is extended or adjusted under 35 U.S.C. 154(b) by 269 days.

(21) Appl. No.: 18/012,308

(22) PCT Filed: Jun. 4, 2021

(86) PCT No.: PCT/EP2021/065078
§ 371 (c)(1),
(2) Date: Dec. 22, 2022

(87) PCT Pub. No.: WO2021/259618
PCT Pub. Date: Dec. 30, 2021

(65) Prior Publication Data
US 2023/0213868 A1 Jul. 6, 2023

Related U.S. Application Data

(60) Provisional application No. 63/042,753, filed on Jun. 23, 2020.

(51) Int. Cl.
*G03F 7/00* (2006.01)
(52) U.S. Cl.
CPC ...... *G03F 7/70258* (2013.01); *G03F 7/70275* (2013.01); *G03F 7/7085* (2013.01)

(58) Field of Classification Search
CPC ............ G03F 7/70258; G03F 7/70275; G03F 7/7085; G02B 6/04; G02B 6/122
See application file for complete search history.

(56) References Cited

U.S. PATENT DOCUMENTS

| 5,933,216 A | 8/1999 | Dunn |
|---|---|---|
| 6,297,876 B1 | 10/2001 | Bornebroek |

(Continued)

FOREIGN PATENT DOCUMENTS

WO WO 2018/036828 A1 3/2018

OTHER PUBLICATIONS

International Search Report and Written Opinion of the International Searching Authority directed to International Patent Application No. PCT/EP2021/065078, mailed Oct. 6, 2021; 10 pages.

(Continued)

*Primary Examiner* — Hung V Nguyen
(74) *Attorney, Agent, or Firm* — Sterne, Kessler, Goldstein & Fox P.L.L.C.

(57) ABSTRACT

A system includes an illumination system, an optical element, a switching element and a detector. The illumination system includes a broadband light source that generates a beam of radiation. The dispersive optical element receives the beam of radiation and generates a plurality of light beams having a narrower bandwidth than the broadband light source. The optical switch receives the plurality of light beams and transmits each one of the plurality of light beams to a respective one of a plurality of alignment sensor of a sensor array. The detector receives radiation returning from the sensor array and to generate a measurement signal based on the received radiation.

20 Claims, 12 Drawing Sheets

(56) References Cited

U.S. PATENT DOCUMENTS

| | | | |
|---|---|---|---|
| 6,961,116 | B2 | 11/2005 | Den Boef et al. |
| 7,254,299 | B2 * | 8/2007 | Izhaky .................. G02F 1/3136 385/39 |
| 7,403,293 | B2 * | 7/2008 | Pellemans .............. G01N 21/47 356/497 |
| 7,511,799 | B2 | 3/2009 | Tel et al. |
| 8,706,442 | B2 | 4/2014 | Mos et al. |
| 11,118,903 | B2 * | 9/2021 | Hill ...................... G01B 11/272 |
| 11,366,270 | B2 * | 6/2022 | Chen .................. G02B 6/02261 |
| 2006/0140536 | A1 | 6/2006 | Aota et al. |
| 2009/0195768 | A1 | 8/2009 | Bijnen et al. |
| 2015/0355554 | A1 | 12/2015 | Mathijssen |
| 2016/0161245 | A1 | 6/2016 | Fu et al. |
| 2018/0238814 | A1 | 8/2018 | Sapiens et al. |
| 2019/0204759 | A1 * | 7/2019 | Shome .................. G03F 9/7073 |
| 2019/0285407 | A1 | 9/2019 | Chuang et al. |
| 2019/0384184 | A1 | 12/2019 | Pandey et al. |

OTHER PUBLICATIONS

International Preliminary Report on Patentability directed to International Patent Application No. PCT/EP2021/065078, issued Dec. 13, 2022; 7 pages.

Raymond et al., "Multiparameter grating metrology using optical scatterometry," Journal of Vacuum Science & Technology B: Microelectronics and Nanometer Structures Processing, Measurement, and Phenomena, vol. 15, No. 2, Jun. 4, 1998; pp. 361-368.

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

"Lithographic Apparatus, Metrology Systems, Illumination Switches and Methods Thereof," Research Disclosure No. 676037, Jul. 7, 2020; 50 pages.

* cited by examiner

LITHOGRAPHIC APPARATUS, METROLOGY SYSTEMS, ILLUMINATION SWITCHES AND METHODS THEREOF

CROSS-REFERENCE TO RELATED APPLICATIONS

This application claims priority of U.S. Provisional Patent Application No. 63/042,753, which was filed on Jun. 23, 2020, and which is incorporated herein in its entirety by reference.

FIELD

The present disclosure relates to metrology systems with integrated optics, for example, illumination systems with integrated photonic devices used in metrology systems for inspecting lithographic processes and wafer alignment.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay (OV) error between two layers formed in or on the patterned substrate. Properties of the substrate can be determined by comparing the properties of an illumination beam before and after the beam has been reflected or scattered by the substrate.

As ICs become smaller and more densely packed, so too increases the number of features that must be inspected per wafer. It is desirable to improve the capabilities of metrology systems in order to keep pace with current high-volume manufacturing rates and improve production speeds beyond what is currently available.

SUMMARY

Accordingly, there is a need to provide metrology tools capable of quickly and accurately measuring a large number of lithographic features. Metrology solutions may include, e.g., increasing the number of simultaneous measurements and/or increasing the speed of a measurement.

In some embodiments, a system includes an illumination system, an optical element, a switching element, and a detector. The illumination system includes a broadband light source that generates a beam of radiation. The dispersive optical element receives the beam of radiation and generates a plurality of light beams having a narrower bandwidth than the broadband light source. The optical switch receives the plurality of light beams and transmits each one of the plurality of light beams to a different alignment sensor of a sensor array. The detector receives radiation returning from the sensor array and to generate a measurement signal based on the received radiation.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
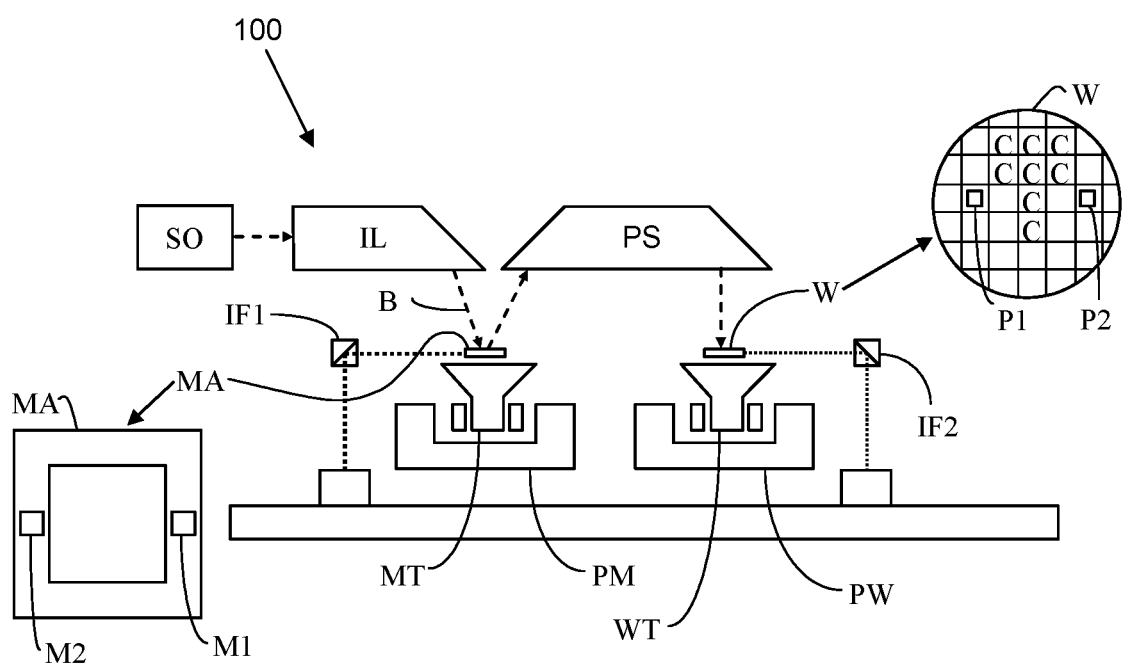
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
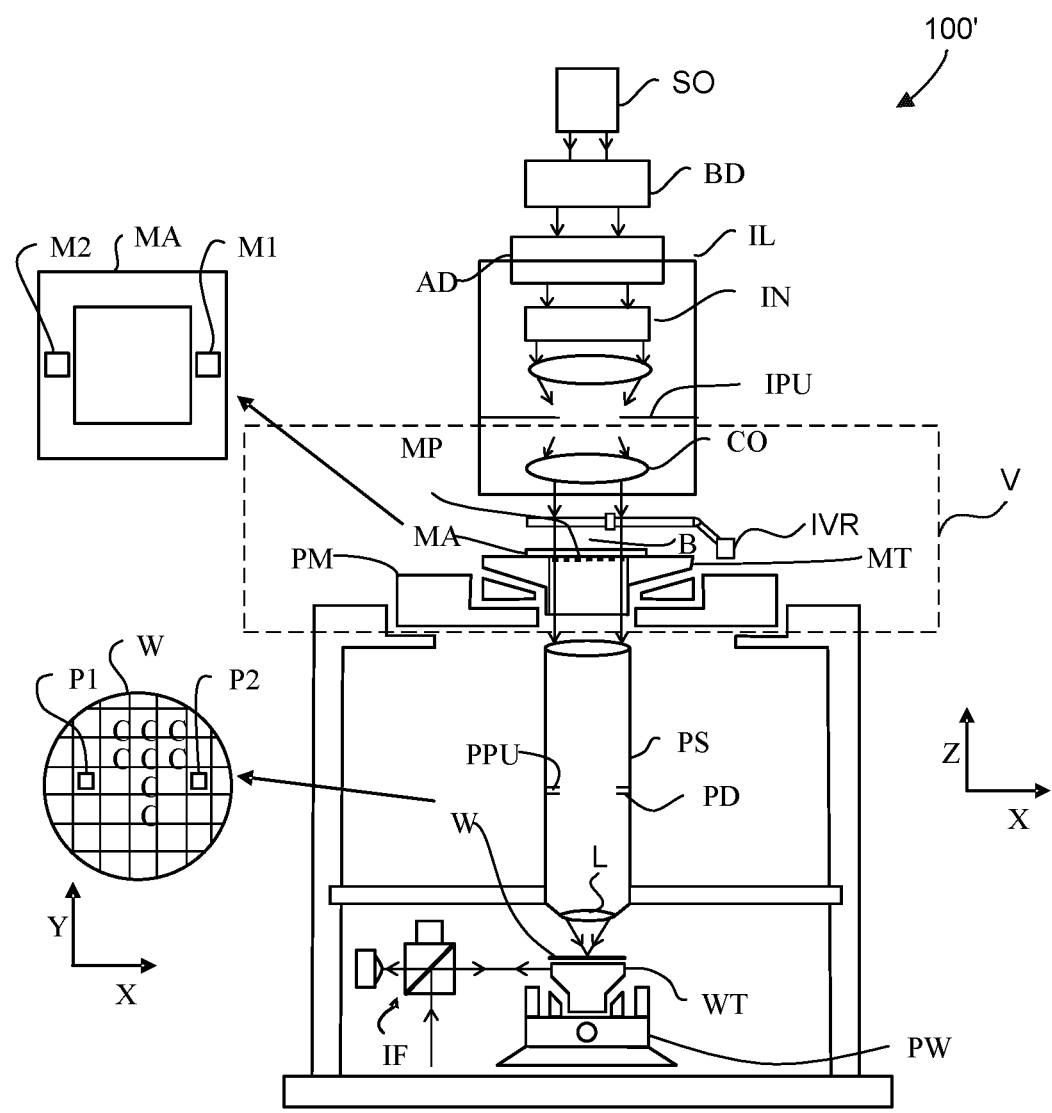
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, is submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-) magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
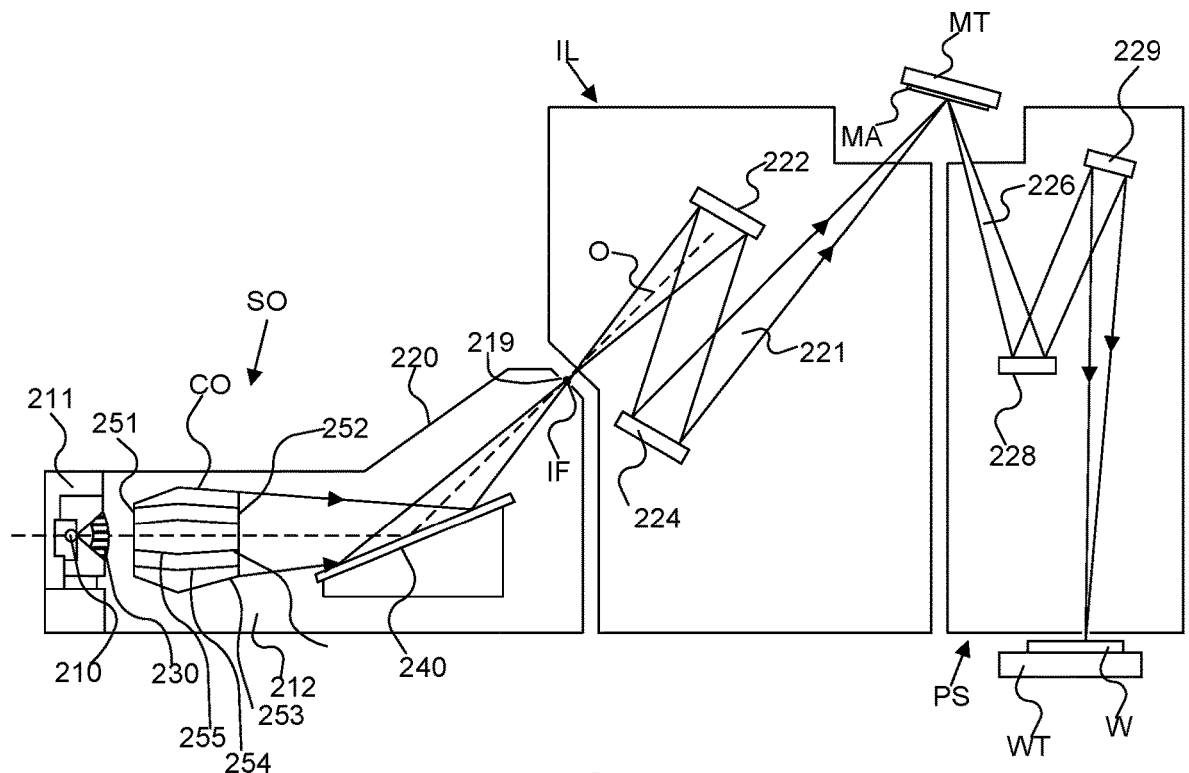
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
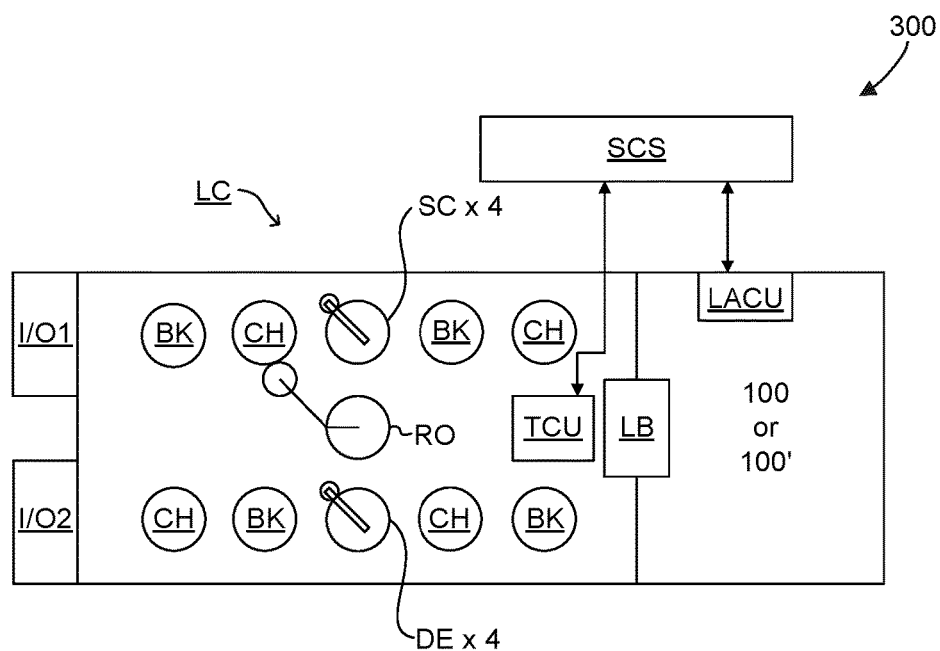
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Inspection Apparatuses

In order to control the lithographic process to place device features accurately on the substrate, alignment marks are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.), which is incorporated by reference herein in its entirety. Generally, marks are measured separately to obtain X- and Y-positions. A combined X- and Y-measurement may be performed using the techniques described in U.S. Publication No. 2009/195768 A (Bijnen et al.), which is also incorporated by reference herein in its entirety.

The terms "inspection apparatus," "metrology apparatus," and the like may be used herein to refer to, e.g., a device or system used for measuring a property of a structure (e.g., overlay error, critical dimension parameters) or used in a lithographic apparatus to inspect an alignment of a wafer (e.g., alignment apparatus).

Figure 4A:
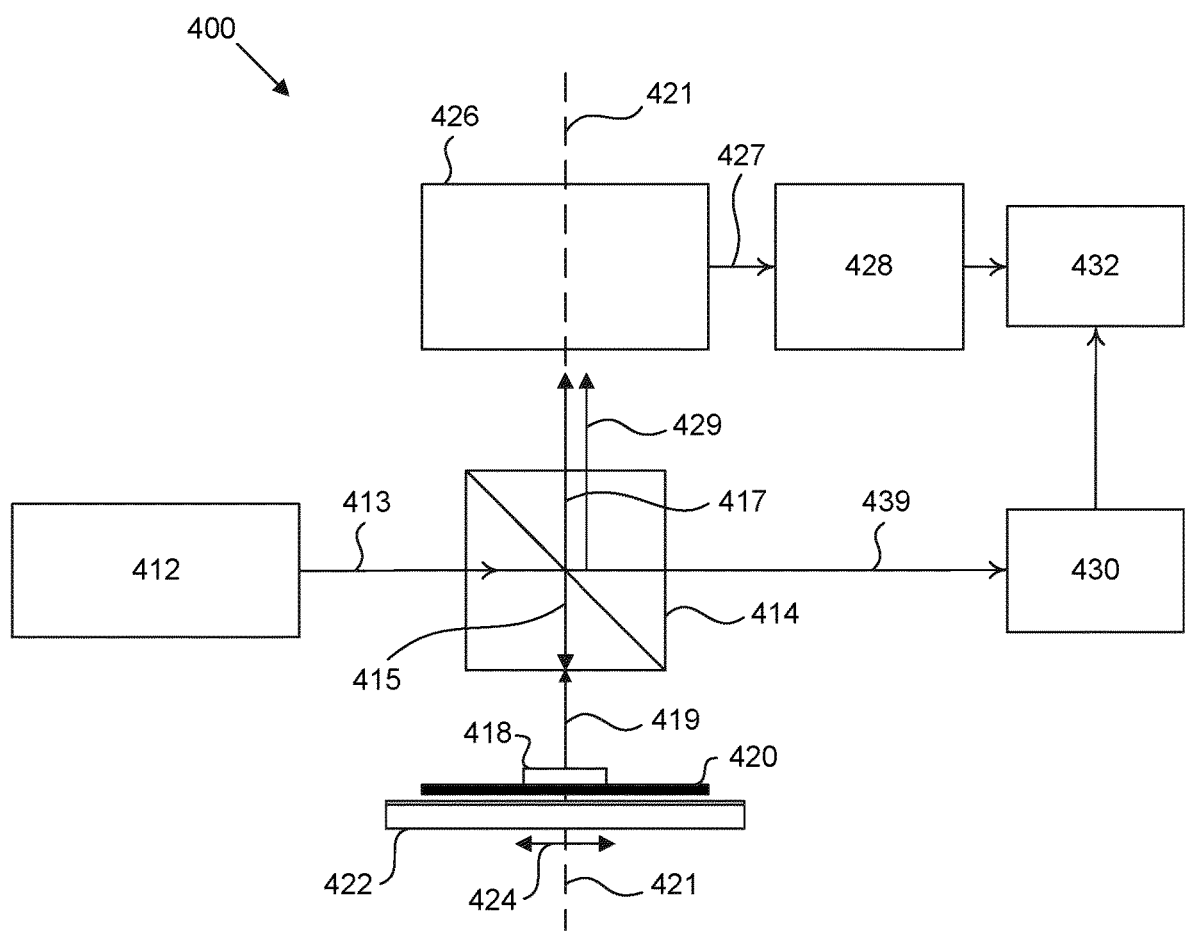
FIGS. 4A and 4B show schematics of alignment apparatuses, according to some embodiments.

FIG. 4A shows a schematic of a cross-sectional view of a metrology apparatus 400, according to some embodiments. In some embodiments, metrology apparatus 400 may be implemented as part of lithographic apparatus 100 or 100'. Metrology apparatus 400 may be configured to align a substrate (e.g., substrate W) with respect to a patterning device (e.g., patterning device MA). Metrology apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

In some embodiments, metrology apparatus 400 may include an illumination system 412, a beam splitter 414, an interferometer 426, a detector 428, a beam analyzer 430, and an overlay calculation processor 432. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current alignment systems. And, as a result, the use of constant CWL values may improve long-term stability and accuracy of alignment systems (e.g., metrology apparatus 400) compared to the current alignment apparatuses.

In some embodiments, beam splitter 414 may be configured to receive radiation beam 413 and split radiation beam 413 into at least two radiation sub-beams. For example, radiation beam 413 may be split into radiation sub-beams 415 and 417, as shown in FIG. 4A. Beam splitter 414 may be further configured to direct radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film. In some embodiments, alignment mark or target 418 may have one hundred and eighty degrees (i.e.,) 180° symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be a resist layer grating comprising bars that are formed of solid resist lines, a product layer grating, a composite grating stack in an overlay target structure comprising a resist grating overlaid or interleaved on a product layer grating, or the like. The bars may alternatively be etched into the substrate. This pattern may be sensitive to chromatic aberrations in the lithographic projection apparatus, particularly the projection system PL, and illumination symmetry and the presence of such aberrations may manifest themselves in a variation in the printed grating. In one example, an in-line method used in device manufacturing for measurements of line width, pitch, and critical dimension makes use of a technique known as "scatterometry". For example, methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

In some embodiments, beam splitter 414 may be further configured to receive diffraction radiation beam 419 and split diffraction radiation beam 419 into at least two radiation sub-beams, according to an embodiment. Diffraction radiation beam 419 may be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements may be used to obtain the similar result of illuminating alignment mark or target 418 on substrate 420 and detecting an image of alignment mark or target 418.

As illustrated in FIG. 4A, interferometer 426 may be configured to receive radiation sub-beam 417 and diffracted radiation sub-beam 429 through beam splitter 414. In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. It should be appreciated that a good quality image need not be formed, but that the features of alignment mark 418 should be resolved. Interferometer 426 may be further configured to rotate one of the two images with respect to the other of the two images 180° and recombine the rotated and unrotated images interferometrically.

In some embodiments, detector 428 may be configured to receive the recombined image via interferometer signal 427 and detect interference as a result of the recombined image when alignment axis 421 of metrolgoy apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data may for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 may be configured to receive and determine an optical state of diffracted radiation sub-beam 439. The optical state may be a measure of beam wavelength, polarization, or beam profile. Beam analyzer 430 may be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 may be configured to determine a position of metrology apparatus 400 or any other reference element such that the center of symmetry of alignment mark or target 418 can be known with reference to metrology apparatus 400 or any other reference element. Beam analyzer 430 may be a point or an imaging polarimeter with some form of wavelength-band selectivity. In some embodiments, beam analyzer 430 may be directly integrated into metrology apparatus 400, or connected via fiber optics of several types: polarization preserving single mode, multimode, or imaging, according to other embodiments.

In some embodiments, beam analyzer 430 may be further configured to determine the overlay data between two patterns on substrate 420. One of these patterns may be a reference pattern on a reference layer. The other pattern may be an exposed pattern on an exposed layer. The reference layer may be an etched layer already present on substrate 420. The reference layer may be generated by a reference pattern exposed on the substrate by lithographic apparatus 100 and/or 100'. The exposed layer may be a resist layer exposed adjacent to the reference layer. The exposed layer may be generated by an exposure pattern exposed on substrate 420 by lithographic apparatus 100 or 100'. The exposed pattern on substrate 420 may correspond to a movement of substrate 420 by stage 422. In some embodiments, the measured overlay data may also indicate an offset between the reference pattern and the exposure pattern. The measured overlay data may be used as calibration data to calibrate the exposure pattern exposed by lithographic apparatus 100 or 100', such that after the calibration, the offset between the exposed layer and the reference layer may be minimized.

In some embodiments, beam analyzer 430 may be further configured to determine a model of the product stack profile of substrate 420, and may be configured to measure overlay, critical dimension, and focus of target 418 in a single measurement. The product stack profile contains information on the stacked product such as alignment mark, target 418, substrate 420, or the like and may include mark process variation-induced optical signature metrology that is a function of illumination variation. The product stack profile may also include product grating profile, mark stack profile, mark asymmetry information, or the like. An example of beam analyzer 430 may be found in the metrology apparatus known as Yieldstar™ manufactured by ASML, Veldhoven, The Netherlands, as described in U.S. Pat. No. 8,706,442, which is incorporated by reference herein in its entirety. Beam analyzer 430 may be further configured to process information related to a particular property of an exposed pattern in that layer. For example, beam analyzer 430 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (e.g., sensor array 1006) may be connected to beam analyzer 430, and allows the possibility of accurate stack profile detection as discussed below. For example, detector 428 may be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but may require separate pre-amps. The number of elements is therefore limited. CCD linear arrays offer many elements that may be read-out at high speed and are especially of interest if phase-stepping detection is used.

Figure 4B:
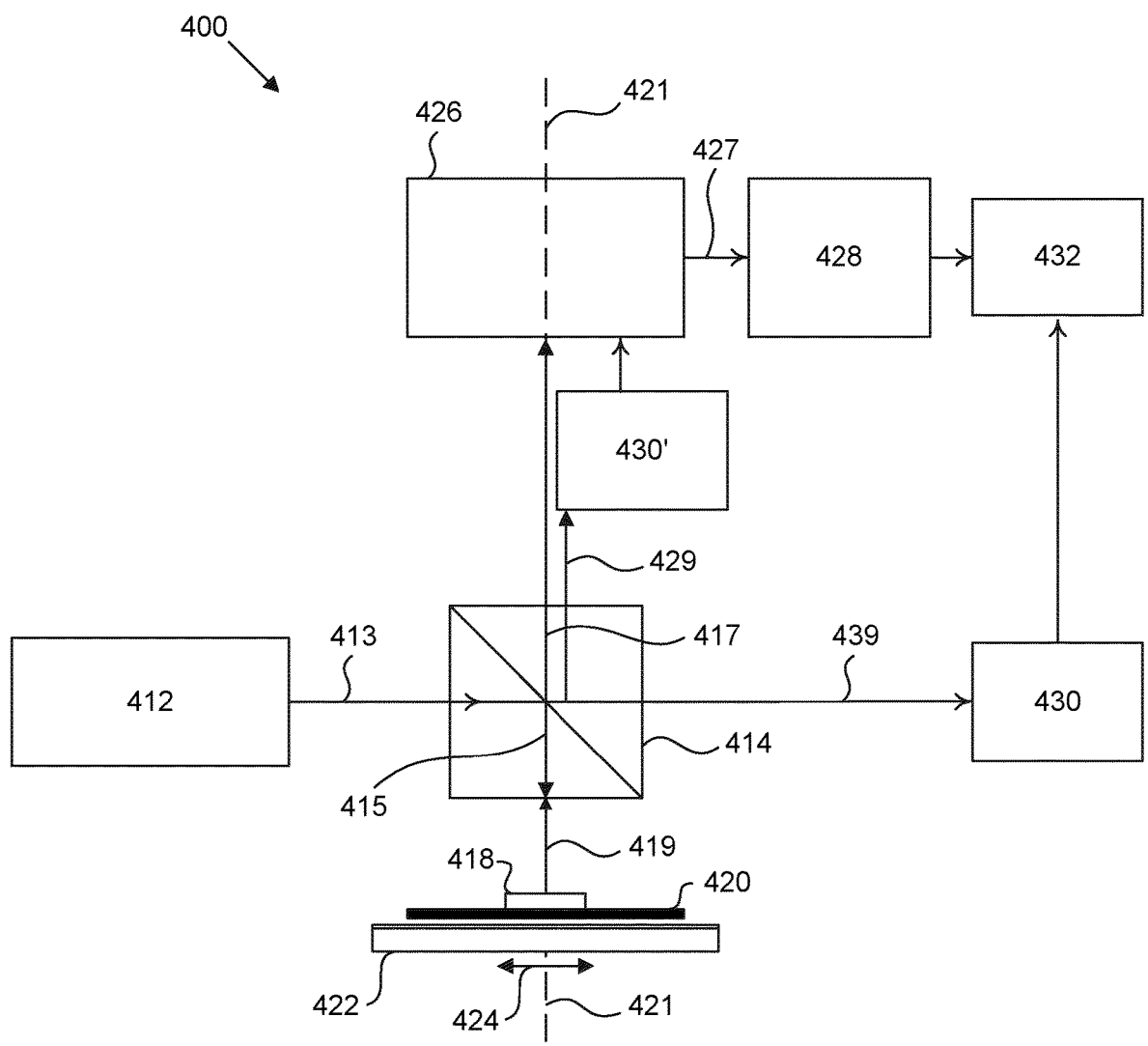

In some embodiments, a second beam analyzer 430' may be configured to receive and determine an optical state of diffracted radiation sub-beam 429, as shown in FIG. 4B. The optical state may be a measure of beam wavelength, polarization, beam profile, or the like. Second beam analyzer 430' may be identical to beam analyzer 430. Alternatively, second beam analyzer 430' may be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' may also be configured to determine a position of metrology apparatus 400, or any other reference element, such that the center of symmetry of alignment mark or target 418 may be known with reference to metrology apparatus 400, or any other reference element. Second beam analyzer 430' may be further configured to determine the overlay data between two patterns and a model of the product stack profile of substrate 420. Second beam analyzer 430' may also be configured to measure overlay, critical dimension, and focus of target 418 in a single measurement.

In some embodiments, second beam analyzer 430' may be directly integrated into metrology apparatus 400, or it may be connected via fiber optics of several types: polarization preserving single mode, multimode, or imaging, according to other embodiments. Alternatively, second beam analyzer 430' and beam analyzer 430 may be combined to form a single analyzer (not shown) configured to receive and determine the optical states of both diffracted radiation sub-beams 429 and 439.

In some embodiments, processor 432 receives information from detector 428 and beam analyzer 430. For example, processor 432 may be an overlay calculation processor. The information may comprise a model of the product stack profile constructed by beam analyzer 430. Alternatively, processor 432 may construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 may create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 may utilize the basic correction algorithm to characterize the metrology apparatus 400 with reference to wafer marks and/or alignment marks 418.

In some embodiments, processor 432 may be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 may utilize a clustering algorithm to group the marks into sets of similar constant offset error, and create an alignment error offset correction table based on the information. The clustering algorithm may be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error may be deduced. Table 1 illustrates how this may be performed. The smallest measured overlay in the example shown is −1 nm. However, this is in relation to a target with a programmed overlay of −30 nm. Consequently, the process has introduced an overlay error of 29 nm.

TABLE 1

| Programmed overlay | −70 | −50 | −30 | −10 | 10 | 30 | 50 |
|---|---|---|---|---|---|---|---|
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value may be taken to be the reference point and, relative to this, the offset may be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 may also be obtained from marks and target 418 under different illumination settings, the illumination setting, which results in the smallest overlay error, and its corresponding calibration factor, may be determined and selected. Following this, processor 432 may group marks into sets of similar overlay error. The criteria for grouping marks may be adjusted based on different process controls, for example, different error tolerances for different processes.

In some embodiments, processor 432 may confirm that all or most members of the group have similar offset errors, and apply an individual offset correction from the clustering algorithm to each mark, based on its additional optical stack metrology. Processor 432 may determine corrections for each mark and feed the corrections back to lithographic apparatus 100 or 100' for correcting errors in the overlay, for example, by feeding corrections into the alignment apparatus 400.

Exemplary Metrology Systems

Until now, the discussion has focused on metrology devices that use optical hardware (e.g., beam splitter 414, interferometer 426, etc.) to collect and direct light received by, e.g., scattered by, the target structure toward a detector. The optical hardware can be used for correcting aberrations or otherwise adjusting radiation that has been scattered by a target structure. In some examples, size requirements of light-directing optical hardware may be accompanied by large sensor footprints, e.g., in the order of approximately 20 mm×20 mm or greater. In these examples, due to large sensor footprints, metrology systems may include only one or a few devices for inspecting a wafer, which may impact the ability to inspect large numbers of wafers in a given time frame. The speed of wafer inspection can be increased by, for example, decreasing the time per measurement (e.g., by collecting more photons) and/or increasing the number of available measurement devices (e.g., by shrinking the device footprint and adding more of them). Embodiments of the present disclosure provide structures and functions to more quickly and efficiently perform inspection of structures on a substrate.

Figure 5C:
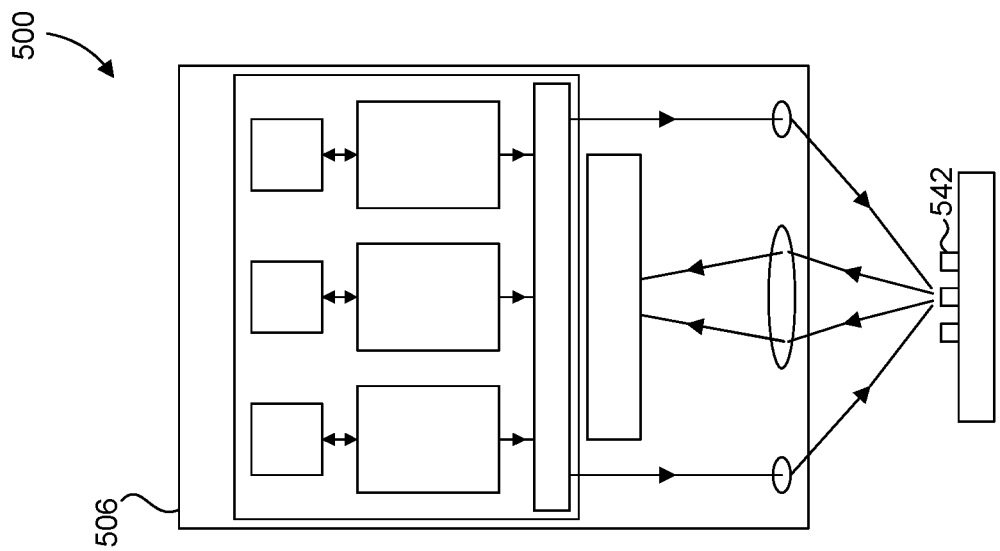
FIGS. 5A-5C shows a schematic of a metrology system, according to some embodiments.
Figure 5B:
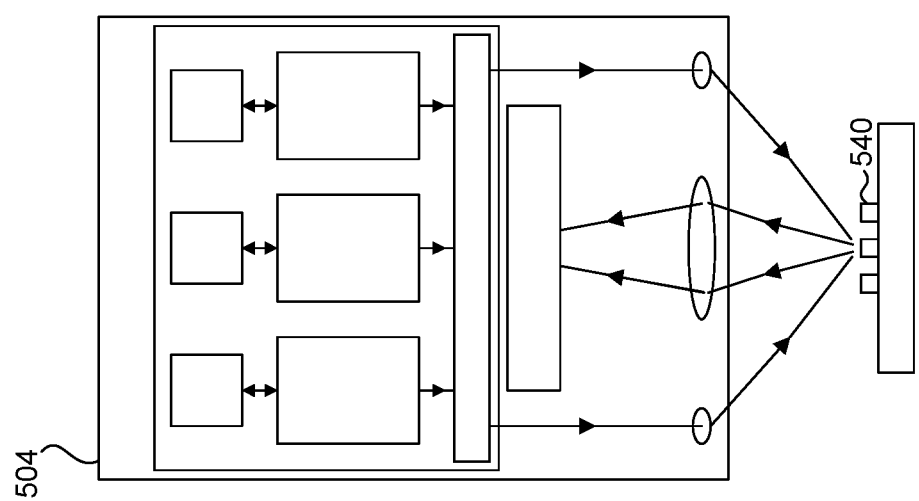
Figure 5A:
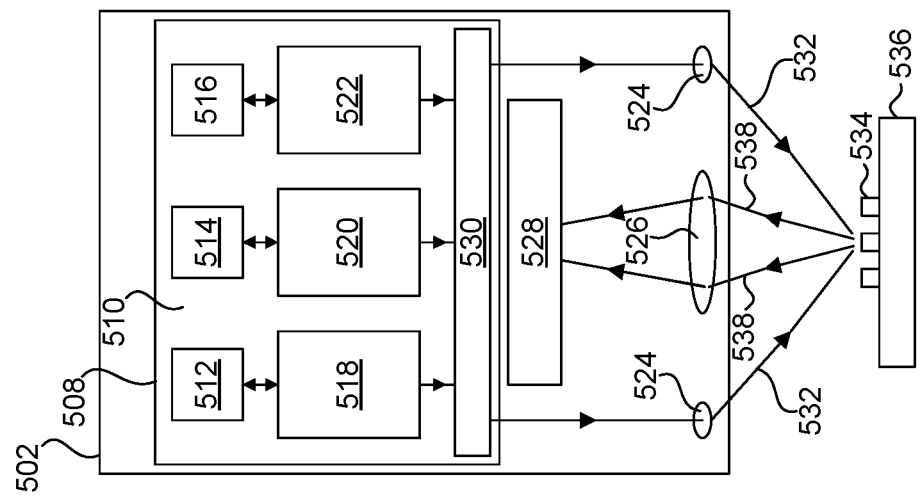

FIGS. 5A-5C shows a schematic of a metrology system 500, according to some embodiments. In some embodiments, metrology system 500 comprises a metrology apparatus 502. Metrology apparatus 502 may comprise an illumination system 508, an optical element(s) 524, and a detector 528. Illumination system 508 may comprise a substrate 510, sources 512 and 514 (or first and second sources), and resonators 518 and 520 (or first and second resonators). Illumination system 508 may comprise additional structures, for example, additional source(s) 516, additional resonator(s) 522, and/or a multiplexer 530. Metrology apparatus 502 may also comprise additional structures, for example, an optical element 526 and other structures not shown here, but described in reference to other figures (e.g., illumination monitor).

According to some embodiments, it may be desirable to generate the desired series of inspection light bandwidths at the source, in which case multiple tunable light sources may be used. U.S. Patent Application Ser. No. 62/954,836 filed Dec. 30, 2019, describes the use of multiple tunable lasers integrated in photonic chip as broadband coherent light source for integrated metrology sensors, and is incorporated herein by reference in its entirety for all purposes. Alternatively, the desired series of inspection light bandwidths may be generated from an initial broadband source (e.g., white light) that is then filtered, processed, and routed using a series of optical elements. Such methodology will be further described herein with regard to FIGS. 5-11.

In some embodiments, all or some of the structures of metrology apparatuses in embodiments herein may be part of an integrated photonic device. For example, at least a portion of illumination system 508 may be implemented on substrate 510 as part of an integrated photonic device that comprises at least source 512 and resonator 518. It should be appreciated that the arrangement shown in FIG. 5—e.g., where the sources, resonators, and multiplexer are on the substrate—is merely an example and that embodiments may be envisaged in which certain structures may be disposed detached from substrate 510 or on multiple substrates brought together. For example, at least a portion of illumination system 508 may comprise an integrated photonic device comprising at least source 512 and resonator 518. Those skilled in the art will appreciate the numerous arrangements that may be envisaged.

In some embodiments, illumination system 508 may be configured to generate a beam of radiation 532 or more than one of beam of radiation 532. For generating beam of radiation 532, source 512 may generate broadband radiation.

In some embodiments, a single one of optical element(s) 524 and optical element 526 may be a single optical component (e.g., one lens) or a system of multiple components, for example, any number and permutation of lenses, reflectors, and systems as described in FIGS. 6-11 below. Optical element(s) 524 may receive multiplexed radiation from multiplexer 530. That is, optical element(s) 524 may be disposed downstream of multiplexer 530. Optical element(s) 524 may direct beam of radiation 532 toward target structure 534. Target structure 534 may be disposed on a substrate 536 (e.g., a wafer) (also "target substrate"). Target structure 534 may comprise an alignment mark, a product feature, or the like. Target structure 534 may reflect, refract, diffract, scatter, or the like radiation to generate radiation 538. For ease of discussion, and without limitation, radiation will be termed scattered radiation throughout. Detector 528 may receive scattered radiation 538. Optical element 526 may be used to direct and/or focus scattered radiation 538 onto detector 528. Optical element(s) 524 and optical element 526 may be at least one of an illumination-redirecting element (e.g., reflector) and a focusing element. Optical element(s) 524 and/or optical element 526 may be disposed on substrate 510 (e.g., fabricated monolithically or assembled from separate, modular components).

In some embodiments, multiplexer 530 may be optional (e.g., may be omitted). In the absence of multiplexer 530, optical element(s) 524 may be disposed downstream of resonator 518, resonator 520, and/or additional resonator(s) 522. Radiation from resonator 518, resonator 520, and/or additional resonator(s) 522 may be guided to one of optical element(s) 524. In some embodiments, radiation from resonator 518, resonator 520, and/or additional resonator(s) 522 may be guided to respective ones of optical element(s) 524 (e.g., along different optical paths). Then, respective ones of optical element(s) 524 may output radiation, for example, at different angles.

In some embodiments, at least one of optical element(s) 524 may comprise a polarizer. In embodiments having distinct optical paths for respective sources, optical element(s) 524 on each optical path may comprise a polarizer. Illumination system 508 may adjust a polarization of beam of radiation 532 based on user-input. For example, a user may desire a given wavelength and polarization. In this scenario, a user may provide input to metrology system 500 (e.g., via a user interface). Illumination system 508 may then adjust a polarizer. In some embodiments, illumination system may select an optical path to activate (e.g., the optical path associated with source 512) while unpowering the other sources or otherwise suppressing the output of the other sources.

In some embodiments, scattered radiation 538 may be received at detector 528. Detector 528 may generate a measurement signal based on the received radiation. detector 528 comprises an image capture device (e.g., a camera). The measurement signal may include data of the detected image.

In some embodiments, a different illumination system may be used. For example, a broadband, white light source may be used. However, a white light source, when powered, generates its full spectrum and it is up to wavelength filtering elements discussed herein in FIGS. 6-10 to select narrow-band wavelength ranges therefrom. In order to avoid wasting a large portion of the spectrum, a plurality of optical elements (e.g., optical elements 524, including reflectors, diffraction gratings, and MEMS switching filters are implemented as will be further described herein.

In some embodiments, metrology apparatus 502 may comprise any number of waveguides to guide radiation, for example, from one element to the next. In some embodiments, waveguides may optically couple a resonator (e.g., resonator 518) to its respective source (source 512). The waveguides may be fabricated on substrate 510 (e.g., monolithically).

In some embodiments, structures of metrology apparatus 502 may be modular. For example, substrate 510 may be a modular structure. Source diodes may have limited lifetimes. It is convenient to be able to remove and replace wear-and-tear components. Therefore, source 512 and other components, may be on a separable part of illumination system 508. According to some aspects, the structures may still be part of an integrated photonic device implemented on substrate 510. For example, the sources may be their own integrated photonic device components that can be assembled onto substrate 510. An interface may be designed in which different wavelengths bands and/or polarizations may be output at specific locations of the substrate (e.g., designs with aligned sources and resonators).

In some embodiments, metrology system 500 may comprise a second metrology apparatus 504 and/or additional metrology apparatus(es) 506. Structures and functions of metrology apparatus 504 and/or additional metrology apparatus(es) 506 may be the same or similar to metrology apparatus 502. In some embodiments, metrology apparatus 504 may be used to interrogate or inspect a target structure 540 (or second target structure). Additional metrology apparatus(es) 506 may be used to interrogate or inspect additional target structure(s) 542 (or corresponding structures). In a non-limiting alternative description, it may be that metrology system 500 further comprise a second illumination system on a second substrate. The second illumination system may be configured to generate a second beam of radiation. The second illumination system may comprise first and second sources configured to generate respective first and second different wavelength bands of the second beam. The second illumination system may comprise components corresponding to the first illumination system. It should also be appreciated that additional iterations of illumination systems, optical elements, and detectors may be envisaged.

As mentioned earlier, speed of wafer inspection may be increased by, for example, increasing the number of available measurement devices (e.g., by shrinking the device footprint and adding more of them). In some embodiments, implementation of integrated photonics allows reduction of device footprint by eliminating the need for large optical hardware. In some embodiments, an integrated-photonics-based metrology apparatus (e.g., metrology apparatus 502) may comprise a footprint having an area less than approximately 2000 mm$^2$, 1000 mm$^2$, 500 mm$^2$, 100 mm$^2$, 50 mm$^2$, 25 mm$^2$, or 16 mm$^2$. The PIC-based metrology system may comprise a footprint having a width less than approximately 40 mm, 30 mm, 20 mm, 10 mm, 7 mm, 5 mm, or 4 mm. By transitive property, these dimensions may also apply to footprints of individual elements within the integrated-photonics-based metrology apparatus.

As noted herein, metrology apparatus may comprise a broadband light source, e.g., light source 512. According to some embodiments, a compact, broadband overlay metrology sensor may be deployed within metrology apparatus 502. Another aspect of increasing processing throughput of sensors and wavelengths may include deployment of a parallel sensor implementation rather than using a single wavelength at a time while utilizing an acousto optic tunable filter (AOTF). According to some aspects, an AOTF may filter a single (or multiple) small wavelength bands from the broadband spectrum output of light source 512.

Depending on the number of wavelength bands that is desired to be generated, one or more AOTFs may be utilized. According to some aspects, a plurality of AOTFs may be utilized at a time, each being configured to select (by filtering) a different wavelength from an illumination supplied by broadband light source 512. Using multiple AOTFs to select different wavelength bands for different parallel sensors (or illumination branches) at the same time enables a limited number of wavelengths to be filtered. Moreover, AOTFs may not necessarily handle a full spectrum of wavelength bands, and therefore, multiple AOTFs may be used per wavelength region. Alternatively, as will be further illustrated in FIG. 6 below, an AOTF may be provided to process light prior to a dispersive element. In this regard, the AOTF can select multiple wavelength bands at once (by applying multiple RF frequencies together). This can be used as a single "pre-filter" to more accurately select a specific center wavelength or bandwidth. One benefit of such implementation may be to relax the parameters of a switch input channel resolution because the center wavelength is more accurately filtered using the AOTF.

As illustrated in FIGS. 6-10 herein, according to some embodiments, a light delivery infrastructure can be simplified by utilizing a series of optical devices that can work to disperse a broadband light (e.g., light beam 532) into small spectral bands, and then distribute the spectral bands over different delivery fibers to sensors. This enables the system to deliver a plurality of wavelength bands to a plurality of sensors simultaneously, which increases testing throughput. Such implementation also allows the system to be less sensitive to mechanical changes and improve maintenance change and upgrades (e.g., less illumination components such as SLED and the like). Moreover, the use of optical components allows for efficient coupling to fibers and selected band delivery to each sensor in parallel as will be further described herein.

Figure 6:
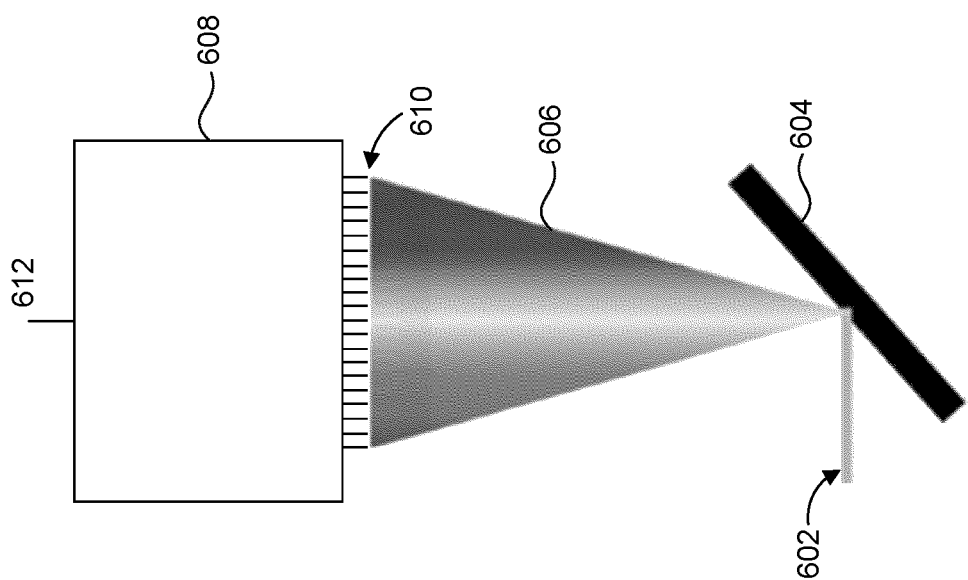
FIG. 6 shows a schematic of an illumination system, according to some embodiments.

FIG. 6 shows a schematic of an illumination system 600, according to some embodiments. It should be appreciated that any of the structures and functions described in reference to FIG. 5 may also be included in embodiments referencing FIG. 6. For example, in some embodiments, illumination system 600 as shown in FIG. 6 may provide a more detailed view of illumination system 508 (FIG. 5). Illumination system 600 illustrates the optical components integrated to deliver wavelength bands to respective sensors in parallel. System 600 includes a generated beam of radiation 602 (which may also be beam of radiation 532). Beam of radiation 532 can comprise a broad continuous spectrum of wavelength bands.

According to some aspects, beam of radiation 532 is incident upon a dispersive element 604. Dispersive element 604 can comprise a grating, a prim, a dichroic mirror or the like. Dispersive element 604 can also include optical ring resonators, planar concave gratings, or arrayed waveguide gratings in on-chip systems. According to some examples, dispersive element 604 generates spectra by optically dispersing the incoming radiation into spectral components 606 (e.g., different wavelengths/colors). Components 606 may be projected onto an optical cross-connect system 608 in which each predetermined wavelength band may be used as in input 610. According to some aspects, the purpose of optical cross connect system 608 may be to provide a switching capability that routs certain inputs to certain outputs. For example, cross connect system 608 may route a first wavelength band to a first output associated with a first sensor, and route a second wavelength band to a second output associated with a second sensor, and so on. As will be further discussed herein, output 612 can represent one or more outputs. In some aspects, output 612 can be configured to correspond to a number of parallel sensors implemented in the system, as will be further described herein.

Figure 7:
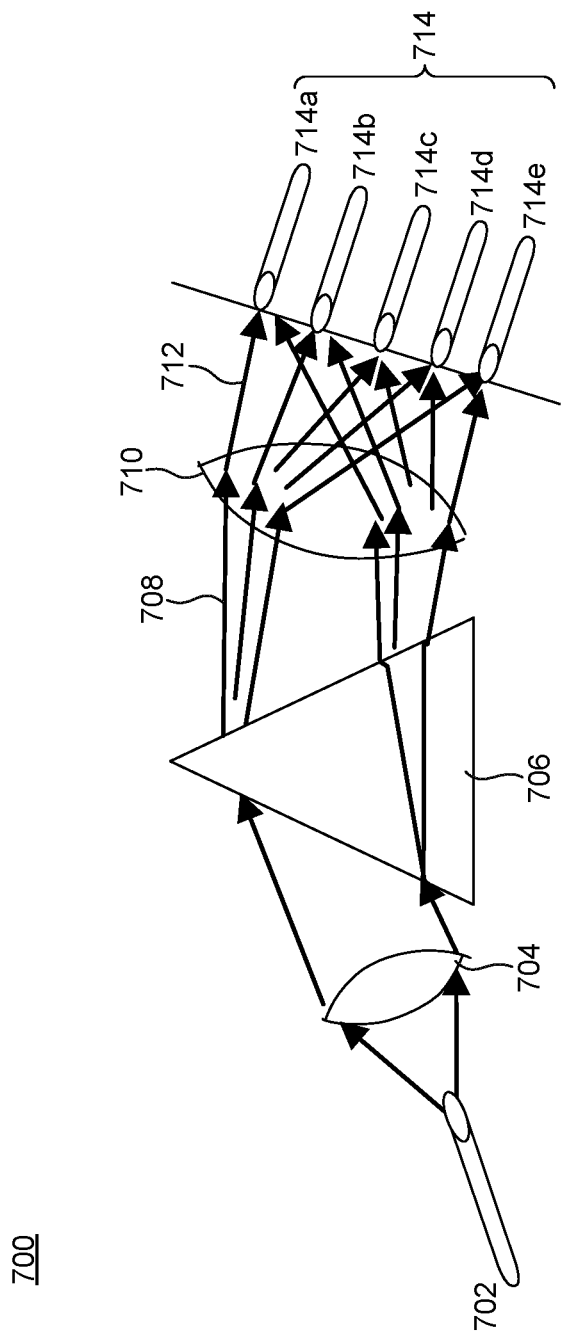
FIG. 7 shows a schematic of light dispersing systems, according to some embodiments.
Figure 8:
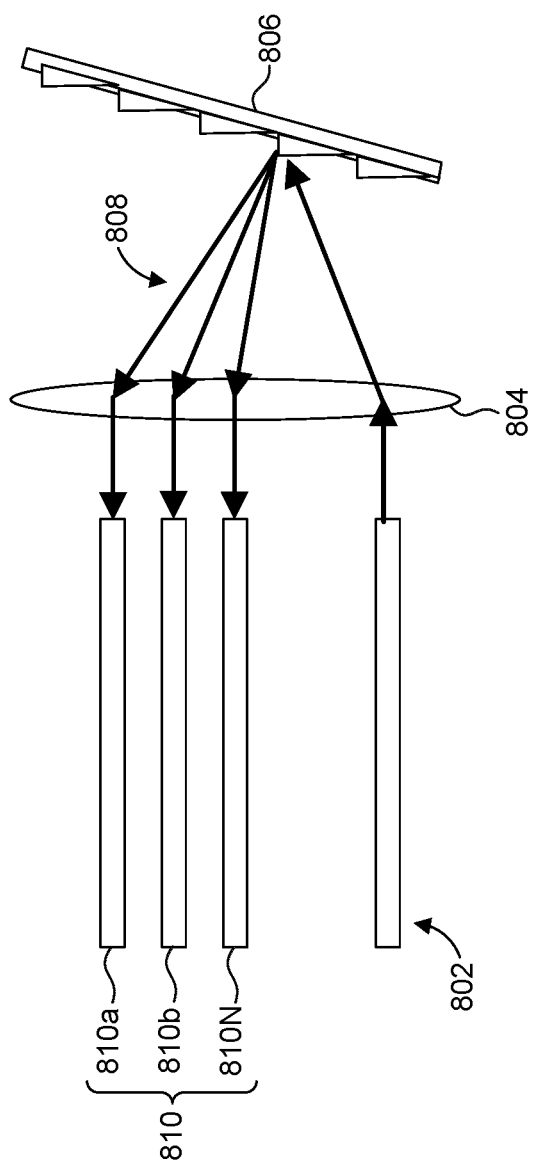
FIG. 8 shows a schematic of light dispersing systems, according to some embodiments.

FIGS. 7 and 8 illustrate two examples of light dispersion using different dispersing elements, according to some embodiments. Dispersion system 700 of FIG. 7 includes a light fiber providing a light beam including a plurality of wavelengths of the visible spectrum. In one example, the light beam may be a white light including all the wavelengths of the visible spectrum at equal intensity (e.g., $\lambda_1+\lambda_2+ \ldots +\lambda_N$). Dispersion system 700 can include one or more dispersive elements. For example, Dispersion system 700 can include a first lens 704, a prism 706 and second lens 710. The plurality of dispersive elements 704, 706 and 710 disperse the light into different components 708 and generate an aligned output of different wavelengths 712. These wavelengths may then be fed into different corresponding fibers 714. For example, wavelength (or wavelength band) 712 (e.g., $\lambda_1+\lambda_2+ \ldots +\lambda_N$) can be fed to each fiber (e.g., $714_1, 714_2, \ldots, 714_N$). According to some aspects, fibers 714 may then be fed into optical cross connect switching that enables the manipulation of simultaneous feeding of different wavelengths to different sensors.

Similar to FIG. 7, FIG. 8 illustrates a dispersion system 800 including an input fiber 802 providing an input or incident light beam, collimating lens 804, grating 806 and output fibers 810. Upon receiving incident light, grating 806 can generate dispersions of light spectra 808 for a variety of wavelength bands (e.g., $\lambda_1+\lambda_2+ \ldots +\lambda_N$) that can be provided to output fibers 810 (e.g., $810_a, 810_b, \ldots, 810_N$). According to some aspects, output fibers 810 may then provide inputs into a switching optical cross connect architecture that can distribute the dispersed wavelengths to parallel sensor architecture. In metrology systems, aspects of inspection may include irradiating each sensor with a wide array of wavelength spectra to generate accurate measurements. Providing one wavelength at a time is inefficient, and time consuming. Accordingly, a combination of light dispersion, selection and routing to a plurality of parallel sensors can significantly improve efficiency and increase throughput.

Figure 9:
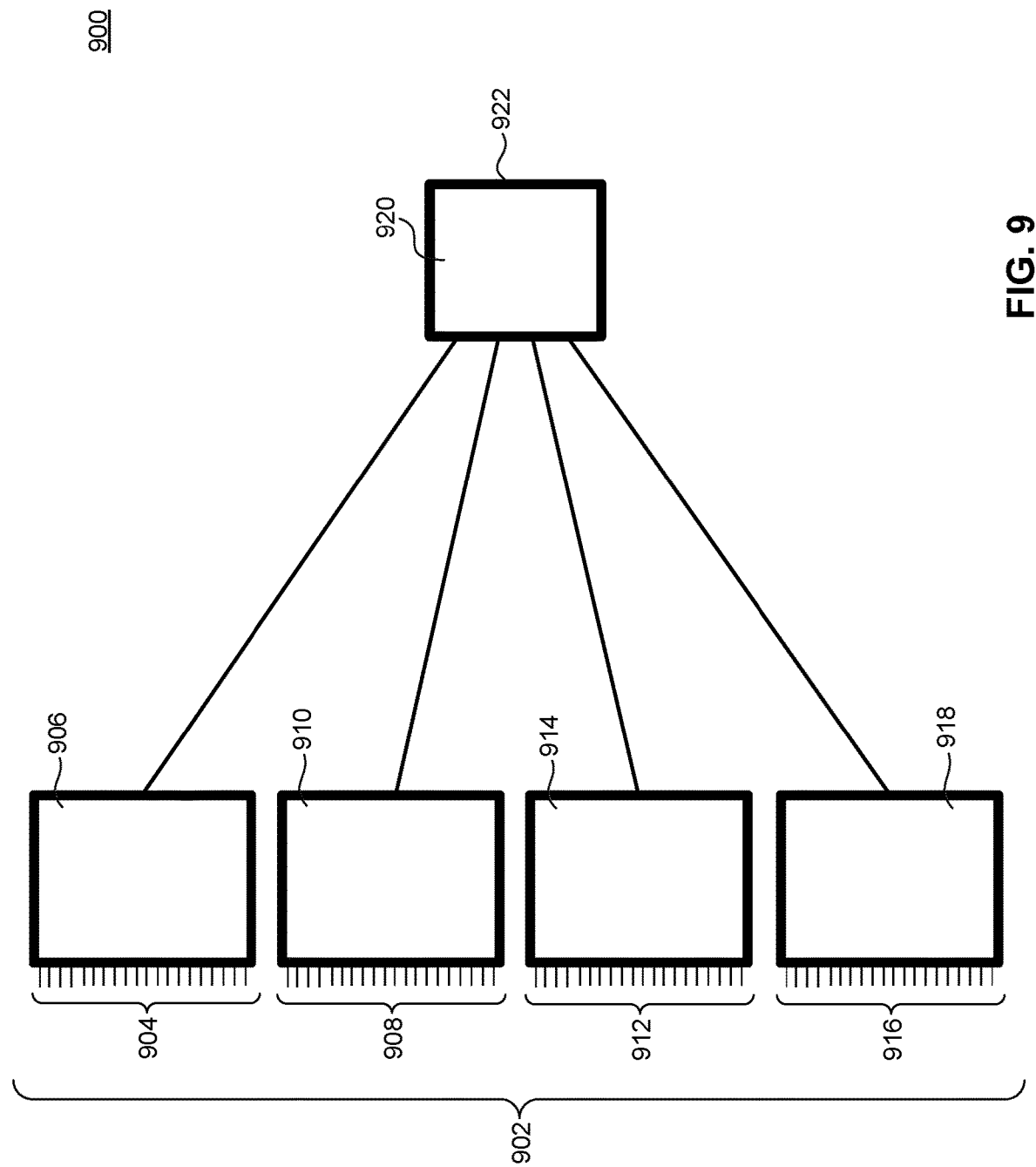
FIG. 9 illustrates a switching architecture according, to some embodiments.

For example, FIG. 9 illustrates a hierarchical switching approach for optical cross connect architecture 900. Architecture may include one or more hierarchies depending on routing schemes, implementations and number of parallel sensors utilized. For example, architecture 900 can include two hierarchies that can serve as switches to route different wavelength bands to different sensors. Since each sensor in a parallel sensor implementation may require exposure to all the wavelength bands, architecture 900 may implement a micro-electro-mechanical-system (MEMS) optical switching techniques that can select and route optical light to different channels. In some aspects, MEMS optical switches include steerable micro mirror arrays that direct the input optical light from input port to a destination port. MEMS optical switches are useful in systems on chip for their efficient performance and compact size.

According to some aspects, architecture 900 may include a plurality of switches 902 (e.g., 904, 908, 912, and 916) each with a predetermined set of inputs. A number of switches 902 can depend on the output wavelength bands generated by the dispersive element previously discussed. Similarly, the hierarchical approach may be implemented based on a number of required outputs (e.g., number of sensors). In one aspect, switches 904, 908, 912, and 916 can be configured to receive the largest amount of wavelengths generated by the dispersive element (e.g., $\lambda_1 \ldots +\lambda_N$) from dispersive element 806) and can narrow the input wavelengths to wavelength bands 906, 910, 914, and 918. It can be appreciated that wavelength bands 906, 910, 914, and 918 can include any number of outputs <N. Hierarchical architecture 900 may further include a second layer of switching (e.g., switch 920) to further narrow the bands (if necessary) and to accommodate a deployed number of parallel sensors. Switch 920 may then provide an output 922 corresponding to the parallel sensors. Accordingly, output 922 may be a predetermined number of outputs (M) corresponding to the number of parallel sensors.

According to some aspects, a wavelength may be routed in series to different parallel sensors so that all the sensors see the same light at the same time. Alternatively, different wavelengths may be shuffled in parallel over multiple sensors. For example, for a time slot to, a first sensor group receives a first wavelength, a second sensor group receives a second wavelength, and a third sensor group receives a third wavelength. At time slot $t_1$, the first sensor group receives the second wavelength, the second sensor group receives the third wavelength, and the third sensor group receives the first wavelength. Moreover, at time slot $t_2$, the first sensor group receives the third wavelength, the second sensor group receives the first wavelength, and the third sensor group receives the second wavelength. In this regard, at time duration equivalent to $t_2$, all sensor groups would have received every wavelength. Accordingly, it can be understood that the use of three sensor groups is but an example, and that any number of sensor groups can be designated based on set up requirements, metrology target designs, tolerances and time constraints.

Typically, in inspection systems, only a very small fraction of the generated light of the broadband light source is used at a given time, which is not efficient. According to some aspects, in a push to achieve higher throughput, shorter acquisition times are used with added parallel sensor deployment. In general, a bright source is needed to accommodate the acquisition time needed for a single sensor.

Therefore, the use of the entire light spectrum, or at least a major portion of it, is beneficial also from a power consumption standpoint. For example, using different wavelengths of the source in parallel, instead of just selecting a single wavelength at one time and throwing the majority of the light away improves processing and throughput. High throughput requires short exposure times, which require high effective source power for a good signal to noise ratio. As such, by using the wavelengths in parallel, the effective usable source power goes up. This can be used to reduce the (expensive) source requirements, or use the extra effective power for more throughput.

Figure 10:
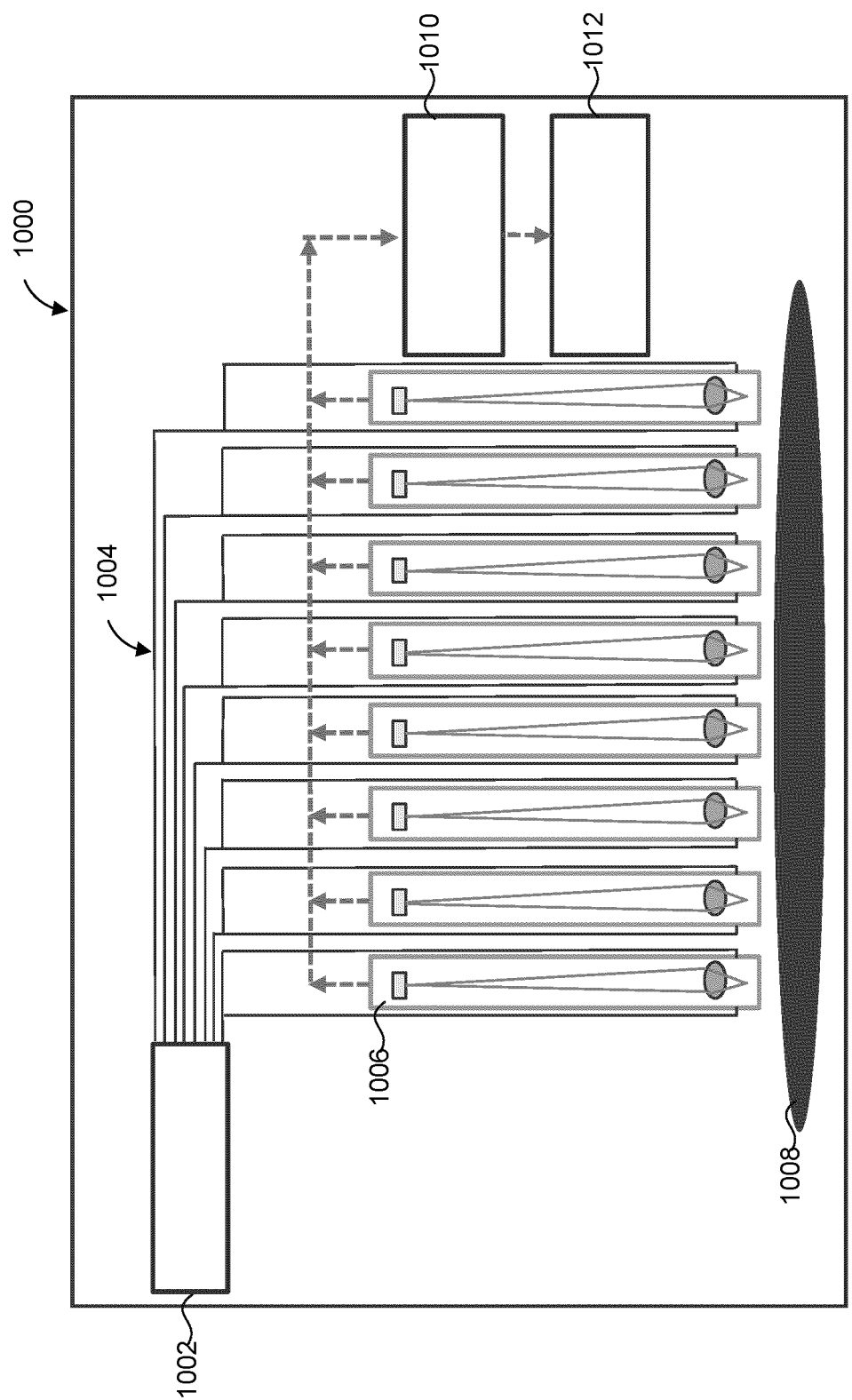
FIG. 10 illustrates an implementation of an optical architecture, according to some embodiments.

FIG. 10 illustrates the implementation of the optical architecture described herein, coupled with a parallel sensor deployment scheme according to some aspects. Inspection system 1000 (or alignment system 1000) may include architecture 1002 that generates a plurality of output fibers corresponding to the number of sensors of sensor array 1006. Architecture 1002 can include illumination system 600 (e.g., illumination source, dispersive element and optical cross connect switching element). According to some aspects, the optical switching element of architecture 1002 can be configured to provide a number of outputs 1004 corresponding to the number of sensors of sensor array 1006 deployed in alignment sensor 1000. This number can be adjusted up or down based on the number of sensor elements deployed. Upon irradiation, sensor array 1006 receives illumination from wafer 1008 and provides parallel output/feedback to a computational module 1010 and scanner controller 1012. It can be understood that sensor output may be image data provided by the sensors. Moreover, computational module 1010 and scanner controller 1012 can be part of a processor (e.g., processor 432).

According to some aspects, it is desirable to minimize the size of the system in order to be integrated on a chip. According to one aspect, integrated optics can be used to implement the entire system, and control it using the systems described herein. Advantages of size reduction allow for more parallel sensor implementation and measurements to measure more marks and increase throughput. Thus, improving inspection times and reducing power requirements.

The present systems, describe methods, and architecture allow for deliberate delivery of signals to a plurality of sensors of a sensor array (e.g., sensor array 1006), one wavelength at a time, for all the sensors. The number of sensors can depend on size requirements, desired throughput and the like. As previously noted, the use AOTF, which is bulky, does not provide the desirable level of control over illumination. The disclosed system-on-a-chip (SoC) implementation enables the selection of frequency and/or wavelength bands and deliver to each sensor in the array at the same time.

According to some aspects, systems of the present disclosure allow inspection apparatus to reduce the time to measure the wavelengths, for the same wafer. Instead of doing them sequentially (current methods), the present disclosure spreads the light to many small bands to measure different wavelengths on different marks at the same time.

Figure 11:
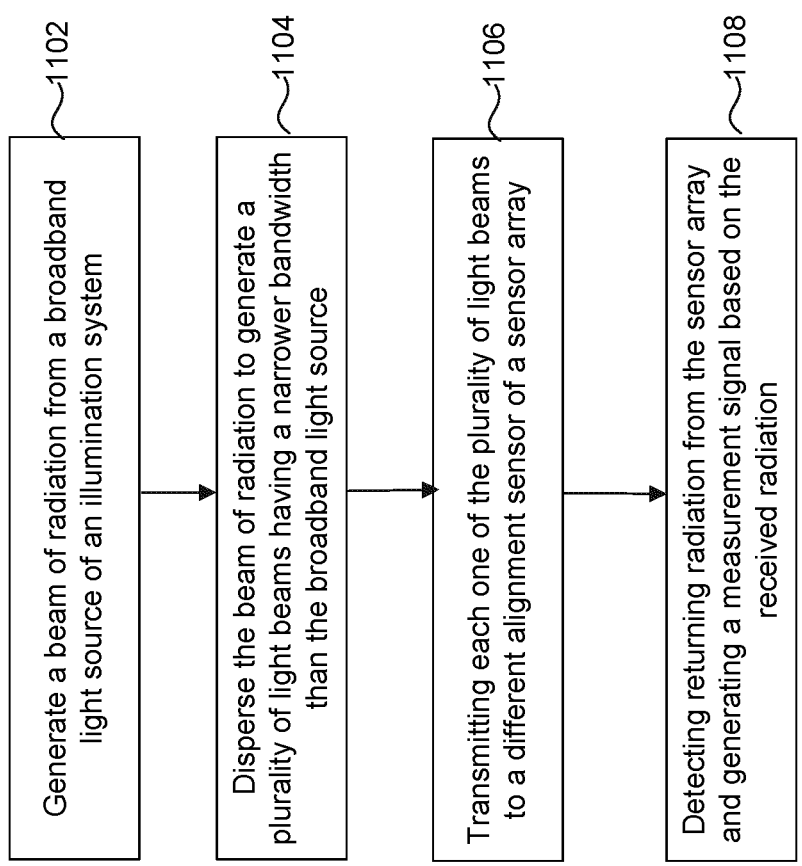
FIG. 11 shows method steps for performing functions of embodiments described herein, according to some embodiments.

FIG. 11 shows method steps for performing functions described herein, according to some embodiments. The method steps of FIG. 11 can be performed in any conceivable order and it is not required that all steps be performed. Moreover, the method steps of FIG. 11 described above merely reflect an example of steps and are not limiting. That is, further method steps and functions may be envisaged based embodiments described in reference to FIGS. 1-10.

Method 1100 includes generating a beam of radiation from a broadband light source of an illumination system, as illustrated in step 1102. According to some embodiments of the present disclosure, the light source may be part of an illumination system using integrated photonics, such as light sources integrated on a chip. According to some embodiments, the illumination system may comprise a combination of integrated optics elements and standalone modular elements. Integrated optics elements can provide compact architecture that can be made cheaper at high volumes. Standalone modular elements like dispersion elements (e.g. prisms) and diffraction elements (e.g., gratings) can support larger spectral bandwidths. Accordingly, based on the spectral requirements of the system, those skilled in the art may appreciate that the illumination system can comprise integrated optics elements, standalone modular elements, or a combination thereof. Method 1100 also includes dispersing the beam of radiation, using a dispersive optical element, to generate a plurality of light beams having a narrower bandwidth than the broadband light source, as illustrated in step 1104. Method 1100 further includes transmitting, using an optical switch, each one of the plurality of light beams to a different alignment sensor of a sensor array, as illustrated in step 1106. According to some aspects, MEMS switches ma include micro-mirrors that are used to reflect a light beam within the switch. In one aspect, the direction in which the light beam is reflected can be changed by rotating the mirror to different angles, allowing the input light to be connected to any output port. In this regard, input light beams can be dynamically switched from the input channels to the output ports, where the output ports are connected to different parallel sensors (e.g., detectors 1006). By rotating the wavelengths in time over the different sensors, all detectors can perform the required measurements at all the required wavelengths, just shifted in time. In a non-limiting example, a first detector may receive the first wavelength routed through MEMS while a second detector may receive a second wavelength routed through MEMS at a first time interval. At a subsequent time interval, the MEMS routs the first wavelength to the second detector, and the second wavelength to the first detector. Method 1100 further includes detecting, at a detector, returning radiation from the sensor array and generating a measurement signal based on the received radiation, as illustrated in step 1108.

In some embodiments, an optical measurement performed on a substrate product (e.g., a wafer) may comprise capturing a high definition image (e.g., using a camera detector) of a target structure on a substrate. One commercially available example is the previously mentioned Yieldstar™ of ASML. Embodiments of the present disclosure (e.g., FIGS. 5-8) may also be used to perform image capture measurements. Referring to FIG. 5, for example, from the measurement signal generated by detector 528, a lithographic property of substrate 536 may be determined (e.g., overlay error, critical dimension parameters, and the like). Furthermore, known computational enhancement techniques may be used for enhancing image clarity/focus of the detected image and/or reducing aberrations arising from the optics of metrology apparatus 502.

In some embodiments, when performing a lithographic process on a substrate, it is important for the substrate to be in precise alignment within the lithographic apparatus such that the newly applied layer lays on top of existing layers on the substrate with precise positioning (overlay). Therefore, lithographic apparatuses rely on metrology systems to measure the position of the substrate relative to the position of the projected illumination pattern of the new layer (e.g., alignment sensors, position sensors IF1 and IF2 in FIG. 1A). Commercially available examples of alignment sensors are the previously mentioned SMASH™ and ATHENA™ sensor by ASML of Netherlands. Structures and functions of alignment sensors have been discussed in reference to FIG. 4 and in U.S. Pat. No. 6,961,116 and U.S. Pub. Appl. No. 2009/195768, which are all incorporated by reference herein in their entireties.

The embodiments may further be described using the following clauses:

1. A system comprising:
    an illumination system, the illumination system including
        a broadband light source configured to generate a beam of radiation;
    a dispersive optical element configured to receive the beam of radiation and generate a plurality of light beams having a narrower bandwidth than the broadband light source;
    an optical switch configured to receive the plurality of light beams and transmit each one of the plurality of light beams to a respective one of a plurality of alignment sensors of a sensor array; and
    processing circuitry configured to receive radiation returning from the sensor array and to generate a measurement signal based on the received radiation.

2. The system of clause 1, wherein each one of the plurality of light beams corresponds to a different wavelength band.

3. The system of clause 2, wherein the processing circuitry is further configured to communicate, to the optical switch, a signal corresponding to a switching operation to re-rout one or more of the plurality of light beams to a different one of the plurality of sensors in the sensor array.

4. The system of clause 2, wherein the optical switch is further configured to transmit each one of the plurality of light beams simultaneously.

5. The system of clause 2, wherein a number of outputs of the optical switch correspond to a number of alignment sensors in the sensor array.

6. The system of clause 1, wherein the plurality of light beams comprise a first light beam having a first wavelength band and a second light beam having a second wavelength band, and the first wavelength band and the second wavelength band comprise a shared wavelength.

7. The system of clause 1, wherein the illumination system is further configured to operate within a broad wavelength range of between approximately 200-2000 nm and wherein the plurality of light beams is within the broad wavelength range.

8. The system of clause 1, wherein at least one of the plurality of light beams has a wavelength band of approximately 20 nm wide or less.

9. The system of clause 1, wherein at least one of the plurality of light beams has a wavelength band of approximately 1 nm wide or less.

10. The system of clause 1, wherein the optical switching element is a micro-electromechanical system (MEMS) optical switch.

11. The system of clause 1, wherein the dispersive optical element comprises an optical ring resonator.

12. The system of clause 1, wherein at least a portion of the illumination system comprises an integrated photonic device comprising at least the light source, the dispersive optical element, and the optical switching element.

13. The system of clause 1, wherein the system has a footprint area less than approximately 2000 $mm^2$, 1000 $mm^2$, 500 $mm^2$, 100 $mm^2$, 50 $mm^2$, 25 $mm^2$, or 16 $mm^2$.

14. The system of clause 1, wherein the detector comprises an image capture device.

15. The system of clause 1, further comprising:
    a second illumination system, the second illumination system including a second broadband light source configured to generate a second beam of radiation;
    a second dispersive optical element configured to receive the second beam of radiation and generate a second plurality of light beams having a narrower bandwidth than the second broadband light source;
    a second optical switch configured to receive the second plurality of light beams and transmit each one of the second plurality of light beams to a respective one of a plurality of alignment sensors of a second sensor array; and
    second processing circuitry configured to receive radiation returning from the second sensor array and to generate a measurement signal based on the received radiation.

16. A lithographic apparatus comprising:
    an illumination apparatus configured to illuminate a pattern of a patterning device;
    a projection system configured to project an image of the pattern onto a target substrate; and
    a metrology system comprising:
        an illumination system, the illumination system including a broadband light source configured to generate a beam of radiation;
        a dispersive optical element configured to receive the beam of radiation and generate a plurality of light beams having a narrower bandwidth than the broadband light source;
        an optical switch configured to receive the plurality of light beams and transmit each one of the plurality of light beams to a respective one of a plurality of alignment sensors of a sensor array; and
        processing circuitry configured to receive radiation returning from the sensor array and to generate a measurement signal based on the received radiation.

17. A method comprising:
    generating a beam of radiation from a broadband light source of an illumination system;

dispersing the beam of radiation, using a dispersive optical element, to generate a plurality of light beams having a narrower bandwidth than the broadband light source;

transmitting, using an optical switch, each one of the plurality of light beams to a respective one of a plurality of alignment sensors of a sensor array; and detecting, with processing circuitry, returning radiation from the sensor array and generating a measurement signal based on the received radiation.

18. The method of clause 17, further comprising:

communicating, to the optical switch, a signal corresponding to a switching operation to re-route one or more of the plurality of light beams to a different one of the plurality of sensors in the sensor array.

19. The method of clause 17, further comprising:

transmitting each one of the plurality of light beams simultaneously.

20. The method of clause 17, the number of outputs of the optical switch corresponding to the number of alignment sensors in the sensor array.

Despite some differences between SMASH-style sensors (e.g., implemented in lithographic apparatuses for alignment) and Yieldstar-style sensors (e.g., implemented outside of a lithographic apparatus for product inspection), the concepts of reduced-footprint metrology apparatus, integrated photonics for illumination, and using a plurality of metrology apparatuses in parallel for measuring more targets in a given time, and the like are applicable to both sensor types.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," and the like as used herein may encompass all types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

As described herein, current systems that rely on broadband light sources rely on a single wavelength band at a time for illumination and processing by using an AOTF filter. However, in this approach, only a small fraction of the generated light of the broadband light source is used at a given time, making for an inefficient process. Accordingly, in the push for higher throughput, shorter acquisition times are required and deployment of parallel detector configuration is provided in embodiments of the present disclosure.

According to some embodiments, an optical system is described including a plurality of optical elements arranged in preconfigured manner to disperse white light radiation into disparate spectral components that are then processed and routed to respective targets and detectors for inspection measurements and calibration. It can be appreciated that such pre-configuration can provide numerous benefits, including reduced component complexities at the source light. Moreover, other benefits include faster and more accurate processing of signals with defined spectral wavelengths. Additionally, such pre-configuration, including, for example, the use of optical components, such as AOTF filters prior to the dispersive element, can help increase selection accuracy of the wavelength bandwidth, leading to a relaxing of tolerances of input channel resolution. Accordingly, the systems and methods described herein deploy a combination of optical system design and computational methods. For example, by deploying the architecture described herein, the wavelength range and application space is extended (e.g., to be applied to a plurality of detectors, in parallel, simultaneously), while maintaining a compact, parallelizable configuration. This provides for a denser sampling process at higher throughput, increasing system performance, and accuracy.

According to some aspects, embodiments of the present disclosure described in FIGS. 6-11 for example, provide for automatic band selection through the use of dispersive elements in combination with optical cross connect architecture. Mating such combination with a hierarchical switching approach of the optical cross connect enables use of routing of multiple inputs to multiple outputs using, for example, a MEMS architecture. Such parallel processing increases throughput of overlay measurements and reduces dependence on computational metrology to calculate overlay. Other benefits of the present embodiments include ease of maintenance through use of modular components, and the ability to scale up by increasing the number of processing components of the optical system. Additionally, due to the modularity of the optical components, the system can be made easier to maintain, change, and upgrade, and allows for efficient coupling to fibers through enabling of selected band selection.

The invention claimed is:

1. A system comprising:
an illumination system, the illumination system including a broadband light source configured to generate a beam of radiation;
a dispersive optical element configured to receive the beam of radiation and generate a plurality of light beams having a narrower bandwidth than the broadband light source;
an optical switch configured to receive the plurality of light beams and transmit each one of the plurality of light beams to a respective one of a plurality of alignment sensors of a sensor array; and
processing circuitry configured to receive radiation returning from the sensor array and to generate a measurement signal based on the received radiation.

2. The system of claim 1, wherein each one of the plurality of light beams corresponds to a different wavelength band.

3. The system of claim 2, wherein the processing circuitry is further configured to communicate, to the optical switch, a signal corresponding to a switching operation to re-route one or more of the plurality of light beams to a different one of the plurality of alignment sensors in the sensor array.

4. The system of claim 2, wherein the optical switch is further configured to transmit each one of the plurality of light beams simultaneously.

5. The system of claim 2, wherein a number of outputs of the optical switch correspond to a number of alignment sensors in the sensor array.

6. The system of claim 1, wherein
the plurality of light beams comprises a first light beam having a first wavelength band and a second light beam having a second wavelength band, and
the first wavelength band and the second wavelength band comprise a shared wavelength.

7. The system of claim 1, wherein the illumination system is further configured to operate within a broad wavelength range of between approximately 200-2000 nm and wherein the plurality of light beams is within the broad wavelength range.

8. The system of claim 1, wherein at least one of the plurality of light beams has a wavelength band of approximately 20 nm wide or less.

9. The system of claim 1, wherein at least one of the plurality of light beams has a wavelength band of approximately 1 nm wide or less.

10. The system of claim 1, wherein the optical switch is a micro-electromechanical system (MEMS) optical switch.

11. The system of claim 1, wherein the dispersive optical element comprises an optical ring resonator.

12. The system of claim 1, wherein at least a portion of the illumination system comprises an integrated photonic device comprising at least the broadband light source, the dispersive optical element, and the optical switch.

13. The system of claim 1, wherein the system has a footprint area less than approximately 2000 $mm^2$, 1000 $mm^2$, 500 $mm^2$, 100 $mm^2$, 50 $mm^2$, 25 $mm^2$, or 16 $mm^2$.

14. The system of claim 1, wherein the processing circuitry comprises an image capture device.

15. The system of claim 1, further comprising:
a second illumination system, the second illumination system including a second broadband light source configured to generate a second beam of radiation;

a second dispersive optical element configured to receive the second beam of radiation and generate a second plurality of light beams having a narrower bandwidth than the second broadband light source;

a second optical switch configured to receive the second plurality of light beams and transmit each one of the second plurality of light beams to a respective one of a plurality of alignment sensors of a second sensor array; and second processing circuitry configured to receive radiation returning from the second sensor array and to generate a measurement signal based on the received radiation.

16. A lithographic apparatus comprising:
an illumination apparatus configured to illuminate a pattern of a patterning device;
a projection system configured to project an image of the pattern onto a target substrate; and
a metrology system comprising:
   an illumination system, the illumination system including a broadband light source configured to generate a beam of radiation;
   a dispersive optical element configured to receive the beam of radiation and generate a plurality of light beams having a narrower bandwidth than the broadband light source;
   an optical switch configured to receive the plurality of light beams and transmit each one of the plurality of light beams to a respective one of a plurality of alignment sensors of a sensor array; and
   processing circuitry configured to receive radiation returning from the sensor array and to generate a measurement signal based on the received radiation.

17. A method comprising:
generating a beam of radiation from a broadband light source of an illumination system;
dispersing the beam of radiation, using a dispersive optical element, to generate a plurality of light beams having a narrower bandwidth than the broadband light source;
transmitting, using an optical switch, each one of the plurality of light beams to a respective one of a plurality of alignment sensors of a sensor array; and
detecting, with processing circuitry, returning radiation from the sensor array and generating a measurement signal based on the received radiation.

18. The method of claim 17, further comprising:
communicating, to the optical switch, a signal corresponding to a switching operation to re-route one or more of the plurality of light beams to a different one of the plurality of alignment sensors in the sensor array.

19. The method of claim 17, further comprising:
transmitting each one of the plurality of light beams simultaneously.

20. The method of claim 17, wherein a number of outputs of the optical switch corresponds to a number of alignment sensors in the sensor array.

\* \* \* \* \*

UNITED STATES PATENT AND TRADEMARK OFFICE
CERTIFICATE OF CORRECTION

| | | |
|---|---|---|
| PATENT NO. | : 12,306,541 B2 | Page 1 of 1 |
| APPLICATION NO. | : 18/012308 | |
| DATED | : May 20, 2025 | |
| INVENTOR(S) | : Swillam et al. | |

It is certified that error appears in the above-identified patent and that said Letters Patent is hereby corrected as shown below:

On the Title Page

Column 2, Item (57), under "Abstract", Line 8, delete "5 beams" and insert -- beams --, therefor.

In the Claims

In Column 28, Claim 6, Line 34, delete "wherein" and insert -- wherein: --, therefor.

Signed and Sealed this
Twenty-fourth Day of June, 2025

Coke Morgan Stewart
*Acting Director of the United States Patent and Trademark Office*